(12) United States Patent
Behfar et al.

(10) Patent No.: US 8,934,512 B2
(45) Date of Patent: Jan. 13, 2015

(54) EDGE-EMITTING ETCHED-FACET LASERS

(71) Applicant: BinOptics Corporation, Ithaca, NY (US)

(72) Inventors: Alex A. Behfar, Keswick, VA (US); Malcolm R. Green, Lansing, NY (US); Cristian Stagarescu, Ithaca, NY (US)

(73) Assignee: BinOptics Corporation, Ithaca, NY (US)

( * ) Notice: Subject to any disclaimer, the term of this patent is extended or adjusted under 35 U.S.C. 154(b) by 0 days.

(21) Appl. No.: 13/690,792

(22) Filed: Nov. 30, 2012

(65) Prior Publication Data

US 2013/0156059 A1    Jun. 20, 2013

Related U.S. Application Data

(60) Provisional application No. 61/568,383, filed on Dec. 8, 2011, provisional application No. 61/619,190, filed on Apr. 2, 2012.

(51) Int. Cl.

| | |
|---|---|
| *H01S 5/026* | (2006.01) |
| *H01S 5/20* | (2006.01) |
| *H01S 5/00* | (2006.01) |
| *H01S 5/02* | (2006.01) |

(Continued)

(52) U.S. Cl.
CPC .............. *H01S 5/20* (2013.01); *H01S 5/0042* (2013.01); *H01S 5/0203* (2013.01); *H01S 5/22* (2013.01); *H01S 5/0201* (2013.01); *H01S 5/028* (2013.01)
USPC ..................................................... 372/45.01

(58) Field of Classification Search
CPC ......... H01S 5/0203; H01S 5/22; H01S 5/028; H01S 5/0201; H01S 5/0042; H01S 27/15–27/156; H01S 5/40; H01S 5/4031; H01S 5/4025
See application file for complete search history.

(56) References Cited

U.S. PATENT DOCUMENTS

| | | | |
|---|---|---|---|
| 4,851,368 A | 7/1989 | Behfar-Rad et al. | |
| 5,032,879 A * | 7/1991 | Buchmann et al. | 257/432 |
| 2002/0051474 A1* | 5/2002 | Choa | 372/45 |

(Continued)

FOREIGN PATENT DOCUMENTS

WO    WO-2005/011076    2/2005

OTHER PUBLICATIONS

Behfar-Rad, A., et al., "Monolithic AlGaAs—GaAs Single Quantum-Well Ridge Lasers Fabricated with Dry-Etched Facets and Ridges", IEEE Journal of Quantum Electronics, May 1992, vol. 28, No. 5, pp. 1227-1231.

(Continued)

*Primary Examiner* — Julio J Maldonado
*Assistant Examiner* — Joshua King
(74) *Attorney, Agent, or Firm* — Wilmer Cutler Pickering Hale and Dorr LLP

(57) ABSTRACT

A laser chip having a substrate, an epitaxial structure on the substrate, the epitaxial structure including an active region and the active region generating light, a waveguide formed in the epitaxial structure extending in a first direction, the waveguide having a front etched facet and a back etched facet that define an edge-emitting laser, and a first recessed region formed in said epitaxial structure, the first recessed region being arranged at a distance from the waveguide and having an opening adjacent to the back etched facet, the first recessed region facilitating testing of an adjacent laser chip prior to singulation of the laser chip.

16 Claims, 8 Drawing Sheets

(51) Int. Cl.
*H01S 5/22* (2006.01)
*H01S 5/028* (2006.01)

(56) References Cited

U.S. PATENT DOCUMENTS

| | | |
|---|---|---|
| 2002/0186736 A1 | 12/2002 | Takahashi |
| 2003/0021319 A1* | 1/2003 | Aoki ............................ 372/46 |
| 2003/0099268 A1 | 5/2003 | Plumb |
| 2006/0291514 A1 | 12/2006 | Behfar et al. |
| 2007/0045637 A1* | 3/2007 | Behfar et al. .................. 257/79 |
| 2008/0017868 A1* | 1/2008 | Yoneda ........................ 257/79 |
| 2008/0298413 A1* | 12/2008 | Behfar et al. ............ 372/45.011 |
| 2009/0068778 A1 | 3/2009 | Bour et al. |
| 2010/0015743 A1* | 1/2010 | Behfar et al. ................... 438/46 |
| 2010/0091809 A1* | 4/2010 | Behfar et al. .............. 372/45.01 |
| 2010/0091811 A1* | 4/2010 | Behfar et al. .............. 372/50.23 |
| 2010/0316076 A1 | 12/2010 | Behfar et al. |
| 2012/0162648 A1* | 6/2012 | Busico et al. ................. 356/402 |

OTHER PUBLICATIONS

International Search Report and Written Opinion for PCT/US12/67612, dated Feb. 15, 2013, 9 pages.

* cited by examiner

EDGE-EMITTING ETCHED-FACET LASERS

CROSS-REFERENCE TO RELATED APPLICATIONS

The present application claims the benefit of priority to U.S. Provisional Application No. 61/568,383, filed Dec. 8, 2011, and U.S. Provisional Application No. 61/619,190, filed Apr. 2, 2012, the entire contents of each of which is herein incorporated by reference.

BACKGROUND OF THE INVENTION

The present invention relates, in general, to etched-facet photonic devices, and more particularly to improved etched-facet photonic devices and methods for fabricating them.

Semiconductor lasers typically are fabricated on a wafer by growing an appropriate layered semiconductor material on a substrate through Metalorganic Chemical Vapor Deposition (MOCVD) or Molecular Beam Epitaxy (MBE) to form an epitaxial structure having an active layer parallel to the substrate surface. The wafer is then processed with a variety of semiconductor processing tools to produce a laser optical cavity incorporating the active layer and incorporating metallic contacts attached to the semiconductor material. Laser mirror facets typically are formed at the ends of the laser cavity by cleaving the semiconductor material along its crystalline structure to define edges, or ends, of the laser optical cavity so that when a bias voltage is applied across the contacts, the resulting current flow through the active layer causes photons to be emitted out of the faceted edges of the active layer in a direction perpendicular to the current flow. Since the semiconductor material is cleaved to form the laser facets, the locations and orientations of the facets are limited; furthermore, once the wafer has been cleaved it typically is in small pieces so that conventional lithographical techniques cannot readily be used to further process the lasers.

The foregoing and other difficulties resulting from the use of cleaved facets led to the development of a process for forming the mirror facets of semiconductor lasers through etching. This process, as described in U.S. Pat. No. 4,851,368, also allows lasers to be monolithically integrated with other photonic devices on the same substrate. It also allows wafer-level testing instead of cleaved bar testing that reduced cost of manufacturing. This work was further extended and a ridge laser process based on etched facets was disclosed in the IEEE Journal of Quantum Electronics, volume 28, No. 5, pages 1227-1231, May 1992. However, FP and DFB edge-emitting lasers fabricated using etched facets could not be closely packed because of the interference of the laser output from a front facet of laser to the back facet of the adjacent laser that would distort on-wafer test results. The solution has been to space out lasers, leaving wasted space between adjacent lasers. For example, for a DFB laser, this wasted space is on the order of 100 µm that significantly reduces the number of useful laser chips that can be produced from a given wafer.

SUMMARY OF THE INVENTION

In general, in one aspect, the invention features edge-emitting lasers that are able to be fabricated with minimal wasted space between adjacent lasers. The front etched facet of a laser is facing a recessed region on the back side of the adjacent laser chip so that the light from the front facet of a first laser can exit without interference and back-reflection from the back facet of a second adjacent laser.

The invention may include a chip with a first etched-facet edge-emitting semiconductor laser, the chip contains a recessed region to allow a second etched-facet edge-emitting semiconductor laser, adjacent to the chip containing the first laser and with its front-facet facing the chip, to be closely spaced to each other while avoiding distortion during the testing of the characteristics of the second laser. This allows a significant increase in the number of chips that can be produced from a wafer.

Other embodiments include one or more of the following features. The recessed region can have a slanted end wall to minimize back-reflection. The back facet of a laser may also face a recessed region on the front side of the adjacent laser chip and the recessed region may have an angled end wall. Chips may have a complete recessed region or complete opening along their length and offset from each other to minimize back reflection.

In one particular embodiment, a laser chip may comprise a substrate; an epitaxial structure on the substrate, the epitaxial structure including an active region, the active region generating light; a waveguide formed in the epitaxial structure extending in a first direction, the waveguide having a front etched facet and a back etched facet that define an edge-emitting laser; and a first recessed region formed in said epitaxial structure, the first recessed region being arranged at a distance from the waveguide and having an opening adjacent to the back etched facet, the first recessed region facilitating testing of an adjacent laser chip prior to singulation of the laser chip.

In accordance with additional aspects of this particular embodiment, the first recessed region has a first end wall.

In accordance with additional aspects of this particular embodiment, the first end wall is at an angle other than normal to the first direction.

In accordance with additional aspects of this particular embodiment, the back etched facet is coated with a highly reflective material.

In accordance with additional aspects of this particular embodiment, the laser chip may further comprise a second recessed region formed in said epitaxial structure and arranged at a second distance from the waveguide having an opening adjacent to the front etched facet, the second recessed region including a second end wall.

In accordance with additional aspects of this particular embodiment, the second end wall is at angle other than normal to the first direction.

In accordance with additional aspects of this particular embodiment, the opening to the first recessed region and the opening to the second recessed region are aligned to each other.

In another particular embodiment, the edge-emitting laser is a ridge laser.

In accordance with additional aspects of this particular embodiment, the ridge laser is of a Fabry-Perot (FP) type.

In accordance with additional aspects of this particular embodiment, the ridge laser is of a distributed feedback (DFB) type.

In accordance with additional aspects of this particular embodiment, the edge-emitting laser is a Buried Heterostructure (BH) laser.

In accordance with additional aspects of this particular embodiment, the BH laser is of a Fabry-Perot (FP) type.

In accordance with additional aspects of this particular embodiment, the BH laser is of a distributed feedback (DFB) type.

In accordance with additional aspects of this particular embodiment, the substrate is InP.

In accordance with additional aspects of this particular embodiment, the substrate is GaAs.

In accordance with additional aspects of this particular embodiment, the substrate is GaN.

In another particular embodiment, a laser chip may comprise a substrate; an epitaxial structure on the substrate, the epitaxial structure including an active region, the active region generating light; a first waveguide formed in the epitaxial structure extending in a first direction, the first waveguide having a first front etched facet and a first back etched facet that define a first edge-emitting laser; a second waveguide formed in the epitaxial structure extending in the first direction, the second waveguide having a second front etched facet and a second back etched facet defining a second edge-emitting laser, a recessed region formed in said epitaxial structure, the recessed region having an opening adjacent to one of the first back etched facet and the second back etched facet, the recessed region facilitating testing of an adjacent laser chip prior to singulation of the laser chip.

In accordance with additional aspects of this particular embodiment, at least one of the first and second edge-emitting lasers is a ridge distributed feedback (DFB) laser.

In accordance with additional aspects of this particular embodiment, at least one of the first and second edge-emitting lasers is a Buried Heterostructure (BH) distributed feedback (DFB) laser.

In another particular embodiment, a laser chip may comprise a substrate; an epitaxial structure on the substrate, the epitaxial structure including an active region, the active region generating light; a waveguide formed in the epitaxial structure extending in a first direction, the waveguide having a front etched facet and a back etched facet that define an edge-emitting laser; and a complete opening in the epitaxial structure in a direction parallel to and at a distance from the waveguide facilitating testing of an adjacent laser chip prior to singulation of the laser chip.

The details of one or more embodiments are set forth in the accompanying drawings and the description below. Other features, objects, and advantages of the described embodiments will be apparent from the description and drawings, and from the claims.

BRIEF DESCRIPTION OF DRAWINGS

The foregoing, and additional objects, features and advantages will be apparent to those of skill in the art from the following detailed description of preferred embodiments thereof, taken with the accompanying drawings, in which.

DETAILED DESCRIPTION OF PREFERRED EMBODIMENTS

Figure 1:
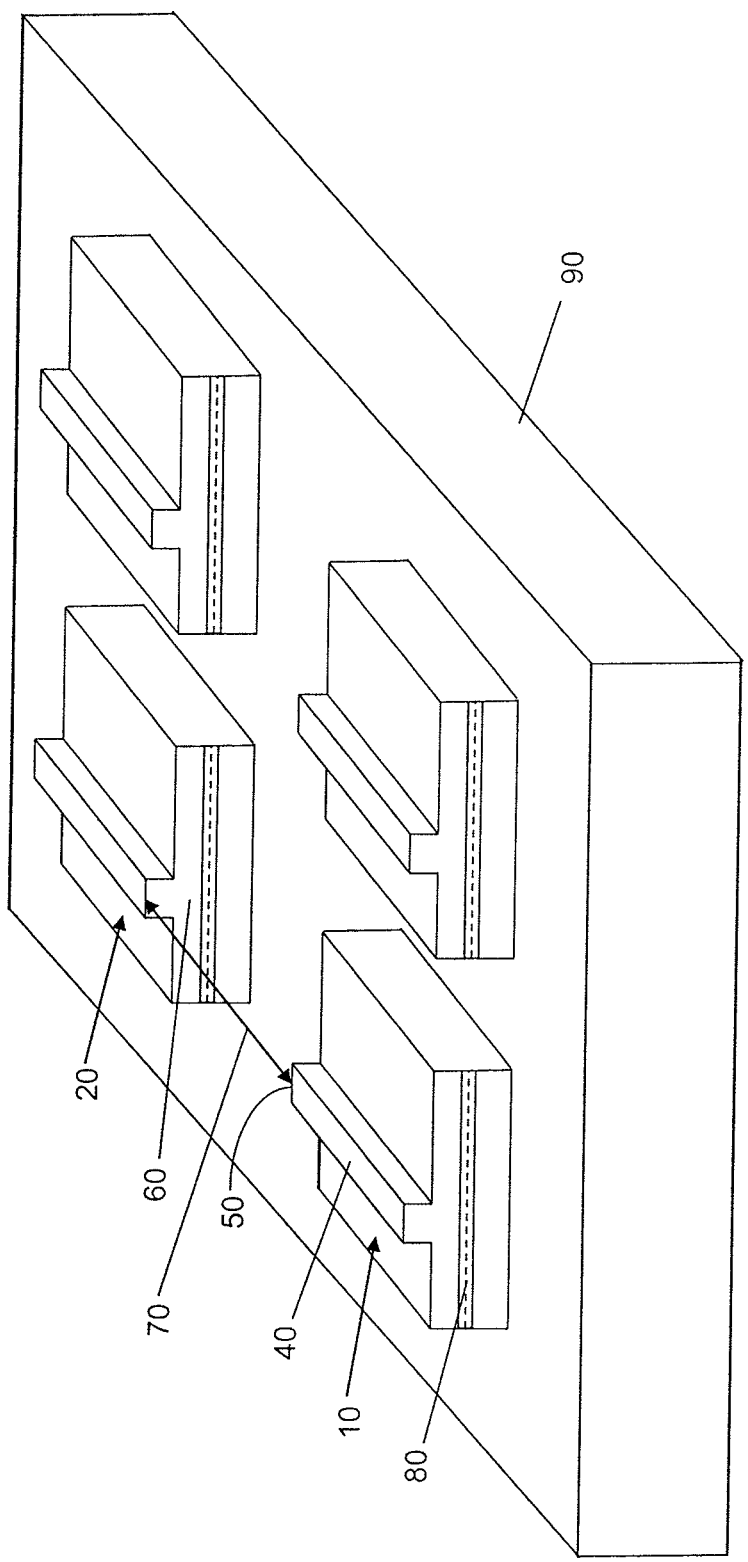
FIG. 1 is a perspective view of edge-emitting etched-facet lasers.

FIG. 1 shows a perspective view of a substrate 90 with an epitaxially deposited waveguide structure including an active region 80 in which etched-facet lasers including a ridge 40 are fabricated. The etched-facet ridge laser mesas 10 and 20 are positioned on the substrate so that the front facet 50 of laser corresponding to mesa 10 is at a distance 70 from the back facet of laser corresponding to mesa 20.

Figure 2:
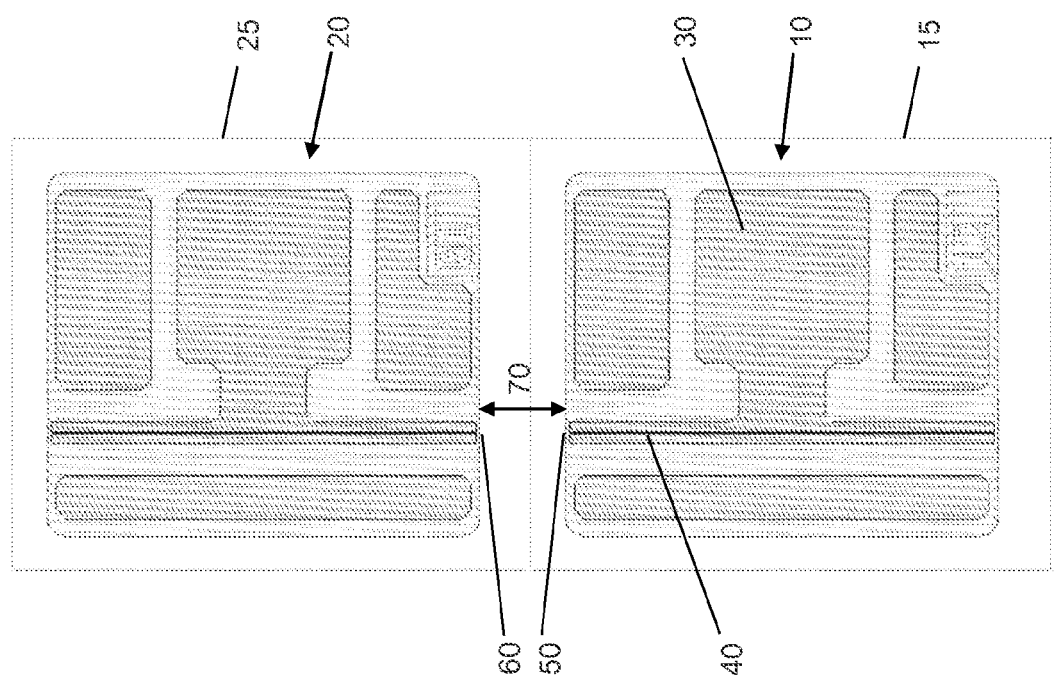
FIG. 2 is a top plan view of two adjacent edge-emitting etched-facet lasers similar to FIG. 1.

FIG. 2 shows a top plan view of two adjacent etched-facet ridge lasers, similar to those in FIG. 1. A wire-bond pad 30 is provided to allow wire-bonding to the pad and for electric current to be directed to the ridge allowing the laser to operate. The laser mesas 10 and 20 are positioned on chip 15 and 25, respectively. The chips 15 and 25 are formed through a singulation process along the lines that define the boundary of the chips in FIG. 2.

The substrate 90 may be formed, for example, of a type III-V compound, or an alloy thereof, which may be suitably doped. The substrate, such as InP, includes a top surface on which is deposited, as by an epitaxial deposition such as Metalorganic Chemical Vapor Deposition (MOCVD) or Molecular Beam Epitaxy (MBE), a succession of layers which form an optical waveguide that includes an active region 80. The semiconductor laser structure may contain upper and lower cladding regions, formed from lower index semiconductor material than the active region 80, such as InP, adjacent the active region 80, which may be formed with InAlGaAs-based quantum wells and barriers. The lower cladding may be formed partially through the epitaxial deposition and partly by using the substrate. For example, a 1310 nm emitting epitaxial structure can be used with the following layers on an InP substrate 90: 0.5 µm n-InP; 0.105 µm AlGaInAs lower graded region; an active region 80 containing five 6 nm thick compressively strained AlGaInAs quantum wells, each sandwiched by 10 nm tensile strained AlGaInAs barriers; 0.105 µm AlGaInAs upper graded region; 1.65 µm thick p-InP upper cladding; and highly p-doped InGaAs cap layer. The structure may also have a wet etch stop layer.

Figure 3A:
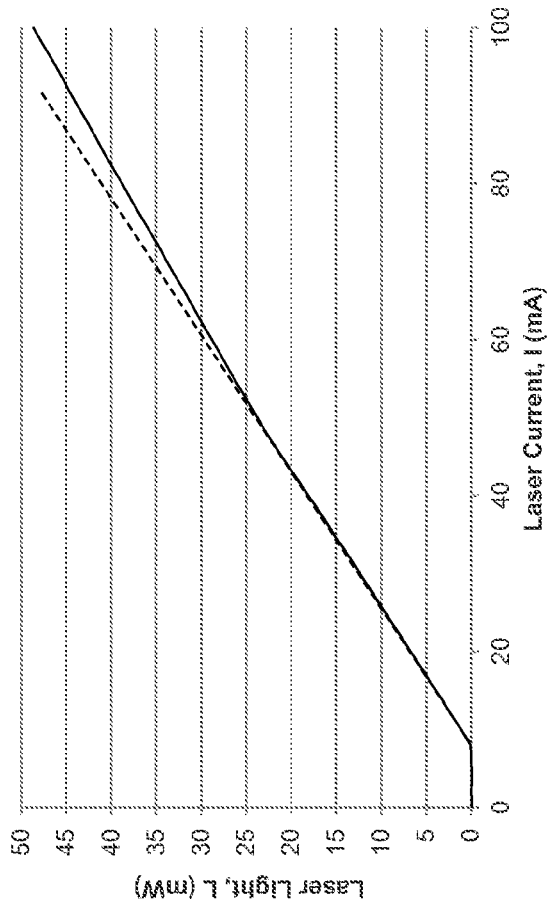
FIG. 3(a) shows the light vs. current and the spectral characteristics of the etched facet Fabry-Perot edge-emitting etched-facet laser with relatively small separation between adjacent lasers.
Figure 3B:
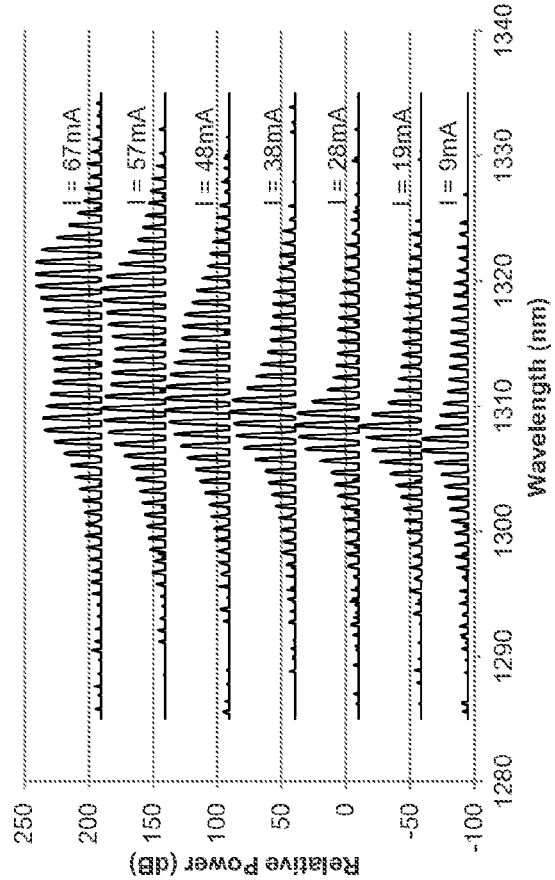
FIG. 3(b) shows the light vs. current and the spectral characteristics of the etched facet Fabry-Perot edge-emitting etched-facet laser with relatively small separation between adjacent lasers.

One of the key benefits of etched-facet lasers is that testing is performed at wafer-level as opposed to bar-level testing for cleaved-facet lasers. However, to allow the full benefit of on-wafer testing, the distance 70 has to be large enough to prevent the adverse impact of back-reflection and interference from back-facet 60 to front facet 50. The front facet 50 is where most of the light emerges from the edge-emitting laser corresponding to mesa 10. For example, if the distance 70 is 50 µm for an InP-based 1310 nm Fabry-Perot (FP) ridge laser of ridge width of about 2 µm, the undesirable characteristics due to the back-reflection are observed in FIG. 3, where FIG. 3(a) shows the laser Light vs. Current (or LI) characteristics starts to change at around 50 mA and a corresponding problem shows up in FIG. 3(b) above 50 mA: the spectral characteristics of the laser have an abnormal double distribution of FP modes at currents above 50 mA. Each spectrum is offset in FIG. 3(b) for clarity.

Figure 4A:
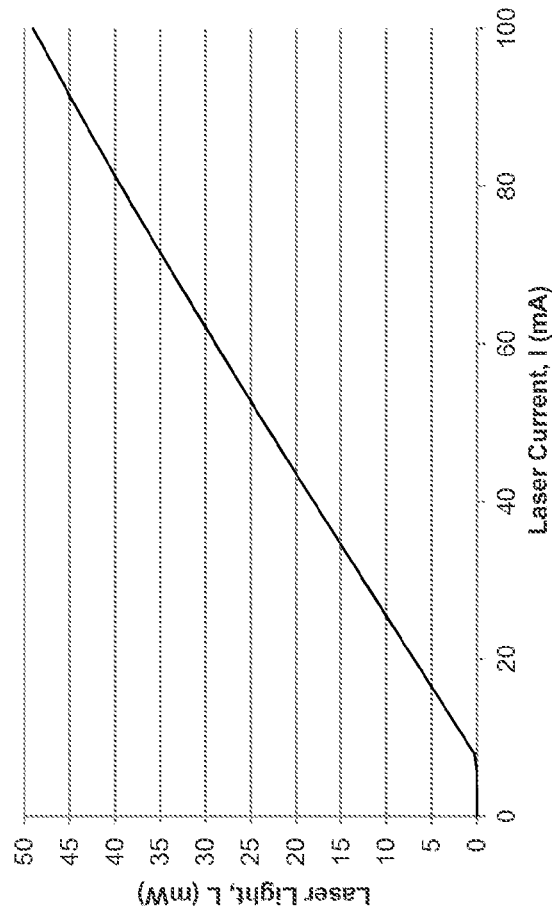
FIG. 4(a) shows the light vs. current and spectral characteristics of the etched facet Fabry-Perot laser with relatively large separation between adjacent lasers.
Figure 4B:
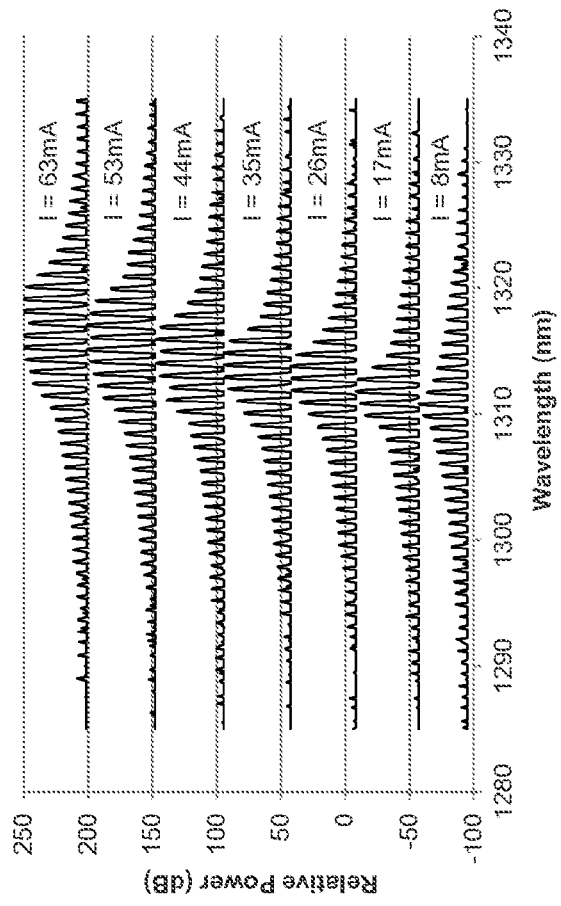
FIG. 4(b) shows the light vs. current and spectral characteristics of the etched facet Fabry-Perot laser with relatively large separation between adjacent lasers.

By increasing the distance 70 to 100 µm or more for the 2 µm ridge width 1310 nm FP lasers, the impact from the back-reflection and interference is minimized and the adverse impact is no longer seen in the LI characteristics of FIG. 4(a) and the spectrum of FIG. 4(b), where each spectrum is offset for clarity. The spectral results in FIG. 4(b) show a normal distribution for the FP modes. The distance 70 is also very important in on-wafer-testing of distributed feedback (DFB) lasers, wherein a grating is incorporated in the epitaxial structure. If the distance 70 is too small, back-reflection can cause a change in the characteristics of the DFB laser and as a result the laser characteristics obtained after singulation may be different, significantly reducing the value of on-wafer testing. By choosing a distance 70 of 100 µm or more, the undesirable impact of the back-reflection has been eliminated for 1310 nm DFB lasers. However, increasing the distance 70 to 100 µm or more is the wasted space that significantly reduces the number of chips that can be obtained from a wafer.

Figure 5:
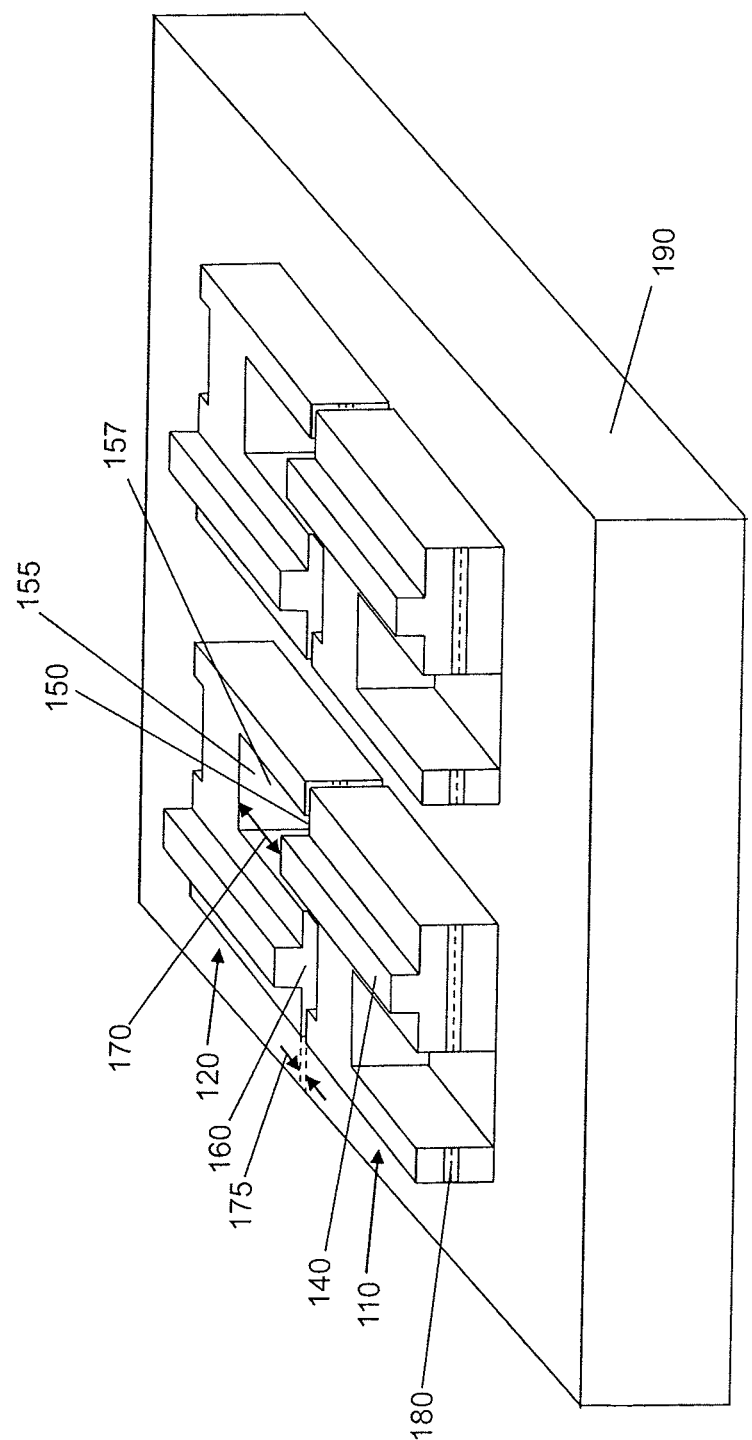
FIG. 5 is a perspective view of edge-emitting etched-facet lasers according to the present invention.

FIG. 5 shows a perspective view of a substrate 190 with an epitaxially deposited structure, similar to the one described above, including an active region 180 in which etched-facet lasers including a ridge 140 are fabricated. The etched-facet lasers are arranged on the substrate in an alternating fashion front-to-back and back-to-front so that the planes of the front and back facets of two neighboring laser mesas face each other (and correspondingly, the planes of the back and front facets of two neighboring laser mesas face each other). In this arrangement, the etched ridge 140 of laser mesa 110 is aligned with recess 157 that is formed in neighboring laser mesa 120. The etched-facet ridge laser mesas 110 and 120 are positioned on the substrate so that the front facet 150 of laser corresponding to mesa 110 is at a distance 170 from the wall 155 of the recessed region 157. The wall 155 can be at an angle other than normal to the incident laser beam to minimize back-reflection to the front facet 150. The recessed region is around 5 µm deep, so that the wall 155 is around 5 µm in height and the floor of the recessed region is about 2.9 µm below the plane of the active region. In the case where the wall 155 is at an angle other than the normal, the distance 170 can be reduced down from 100 µm, while avoiding the back-reflection and interference at levels that are detrimental to on-wafer testing.

Figure 6:
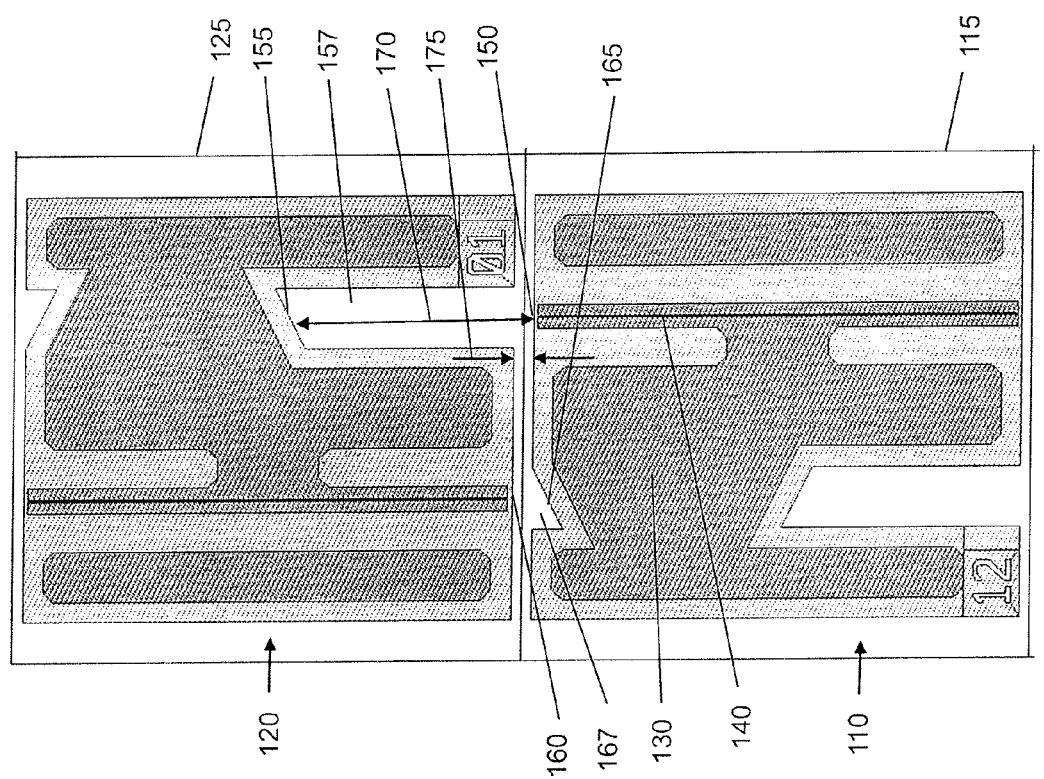
FIG. 6 is a top plan view of two adjacent edge-emitting etched-facet lasers according to the present invention similar to FIG. 5.

FIG. 6 illustrates a top plan view of two adjacent edge-emitting etched-facet lasers, similar to FIG. 5. In practice, the two adjacent edge-emitting lasers of FIG. 6 are used as a unit building block and placed on the wafer in rows and columns. The back facet 160 of laser corresponding to mesa 120 is high reflectivity coated, and as such, the impact of back-reflection is not too great. Nevertheless, a recessed region 167 can be provided for minimizing back-reflection. The wall 165 of the recessed region 167 can also be at an angle other than normal to the incident laser beam to minimize back-reflection to the back facet 160. The laser mesas 110 and 120 are positioned on chip 115 and 125, respectively. The chips 115 and 125 are formed through a singulation process along the lines that define the boundary of the chips in FIG. 6. The chip 115 including a wire-bond pad 130. The separation 175 between laser mesas 110 and 120 is just large enough (around 10 µm) to allow the singulation to occur. The minimization of separation 175 has allowed a significantly larger number of laser chips to be produced from the same size wafer. Further, the recessed regions 157 or 167 may be formed at the same time that the dry etched facet and dry etched ridge are formed.

Figure 7:
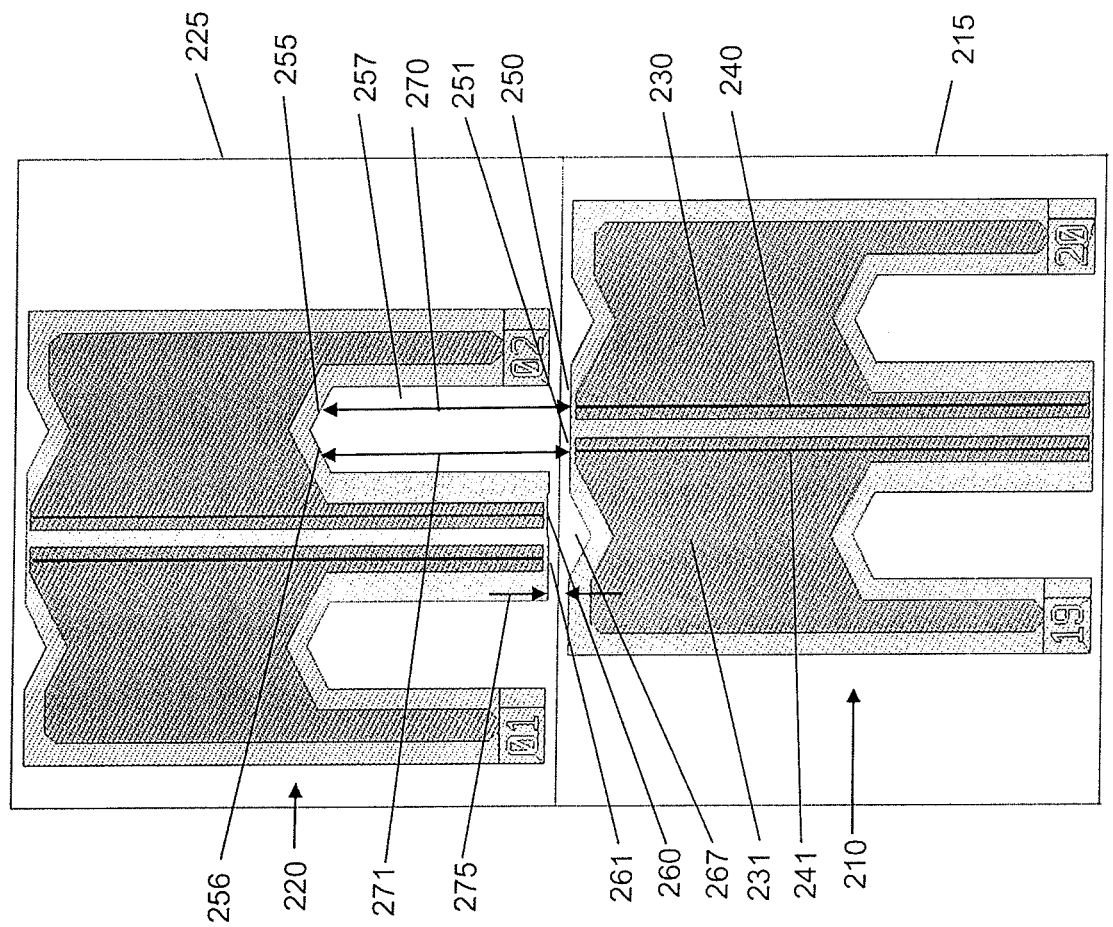
FIG. 7 is a top plan view of adjacent edge-emitting dual-cavity etched-facet DFB lasers according to the present invention.

FIG. 7 shows the application of the present invention to the case of two laser cavities per chip. The laser mesas 210 and 220 are positioned on chip 215 and 225, respectively. The chips 215 and 225 are formed through a singulation process along the lines that define the boundary of the chips in FIG. 7. The chip 215 comprises two laser ridge cavities 240 and 241 that have wire-bond pads 230 and 231, respectively, providing electrical current to the ridges 240 and 241. Ridge laser 240 has a front facet 250 and ridge laser 241 has a front facet 251. The adjacent mesa has a recessed region 257 in front of facets 250 and 251. The recessed region has a termination of two walls 255 and 256 that can be at an angle off from the normal to each laser beams emerging from facets 250 and 251, respectively. The distance 270 between the front facet 250 and the wall 255 is preferably more than 100 µm, but could be shorter if the wall is at an angle to the normal of the laser beam emerging from facet 250. Similarly, the distance 271 between the front facet 251 and the wall 256 is preferably more than 100 µm, but could be shorter if the wall is at an angle to the normal of the laser beam emerging from facet 251. This allows the laser mesas 210 and 220 to have a minimal separation 275 to increase the number of chips that can be produced from a given wafer. The back facets 260 and 261 of the two lasers in mesa 220 can also face a recessed region 267 in the mesa 210 to minimize back-reflection.

Figure 8:
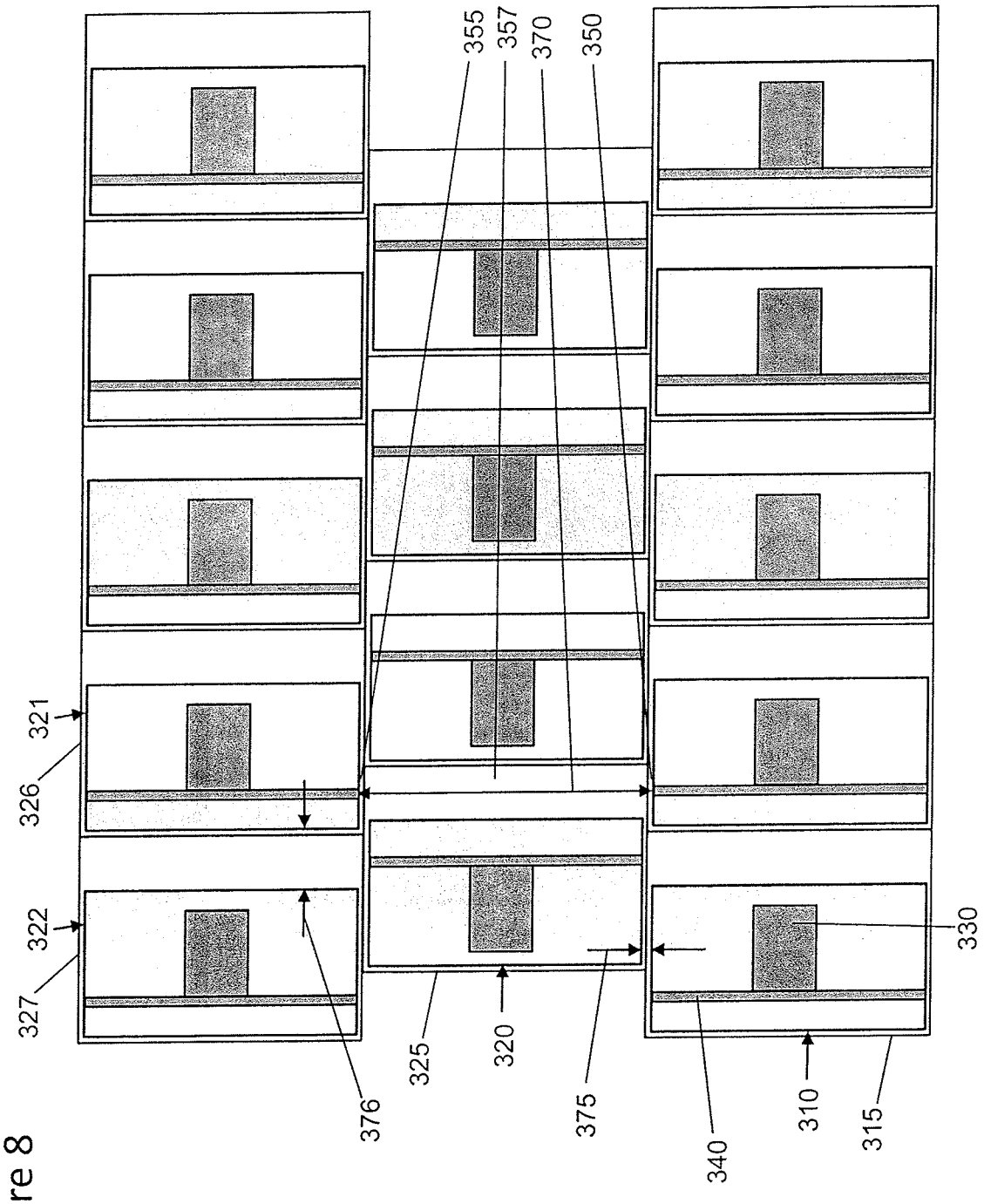
FIG. 8 is a top plan view of edge-emitting etched-facet lasers with laser chips offset from each other in each row of lasers.

Another alternative according to the present invention is illustrated in FIG. 8, where the etched-facet edge-emitting laser mesas 310, 320, 321 and 322 are positioned on chips 315, 325, 326 and 327, respectively, and the lasers have a ridge 340 and a wire-bond pad 330 to provide electrical current to the ridge, as illustrated for laser corresponding to mesa 310. The recessed region 357 is formed completely on one side of the etched-facet laser chip 320 extending the full length of the chip, forming a complete opening. In this way, the recessed region 357 extends to the back facet 355 of a laser corresponding to mesa 321. The back facet 355 is usually normal to the emitted laser light that emerges from front facet 350. The distance 370 is the distance between front facet 350 and back facet 355. Laser mesas 310 and 320 have minimal separation 375 in the top-to-bottom direction, similar to that in FIGS. 6 and 7; however, laser mesas 321 and 322 also have minimal separation 376 in the left-to-right direction. This further allows an increase in the number of chips that can be produced from a given wafer. The sides of chips are only aligned in left-to-right, as opposed to the chips in FIGS. 6 and 7 that are aligned in both left-to-right and top-to-bottom. The singulation needs to accommodate this fact, and for example, the singulation needs to occur in the left-to-right direction first, and then chips separated by top-to-bottom singulation. Although FIG. 8 and the above description are in terms of a single laser cavity per chip, it will be understood that the same approach would be applicable to two or more laser cavities per chips.

The current invention is described using a 1310 nm emitting laser that is based on an InP substrate. However, a number of other different epitaxial structures based on InP, GaAs, and GaN substrates, for example, can benefit from this invention. Numerous examples of epitaxial structures including active layers on these exemplary substrates are available that emit, for example, wavelengths in the infrared and visible regions of the spectrum. Further, although an edge-emitting ridge laser having an etched ridge has been described, it will be understood that other types of etched-facet lasers, such as etched-facet Buried Heterostructure (BH) lasers, can be used.

Although the present invention has been illustrated in terms of various embodiments, it will be understood that variations and modifications may be made without departing from the true spirit and scope thereof as set out in the following claims. Further, it will be understood that the dimensions and proportions shown in the figures are not necessarily to scale, but are used to clearly illustrate the salient features of the structure and method.

The invention claimed is:

1. A laser chip comprising:
   a substrate;
   an epitaxial structure on the substrate, the epitaxial structure including an active region, the active region generating light;
   a waveguide formed in the epitaxial structure extending in a first direction, the waveguide having a front etched facet and a back etched facet that define an edge-emitting laser;
   a first recessed region formed in said epitaxial structure, the first recessed region including a first end wall and two side walls and being arranged at a first distance from the waveguide and having an opening adjacent to the back etched facet, the first recessed region facilitating testing of an adjacent laser chip prior to singulation of the laser chip; and
   a second recessed region formed in said epitaxial structure, the second recessed region including a second end wall and two side walls and being arranged at a second distance from the waveguide and having an opening adjacent to the front etched facet;
   wherein the opening to the first recessed region and the opening to the second recessed region are aligned to each other.

2. The laser chip of claim 1, wherein the first end wall is at an angle other than normal to the first direction.

3. The laser chip of claim 2, wherein the back etched facet is coated with a highly reflective material.

4. The laser chip of claim 1, wherein the second end wall is at angle other than normal to the first direction.

5. The laser chip of claim 1, wherein the edge-emitting laser is a ridge laser.

6. The laser chip of claim 5, wherein the ridge laser is of a Fabry-Perot (FP) type.

7. The laser chip of claim 5, wherein the ridge laser is of a distributed feedback (DFB) type.

8. The laser chip of claim 1, wherein the edge-emitting laser is a Buried Heterostructure (BH) laser.

9. The laser chip of claim 8, wherein the BH laser is of a Fabry-Perot (FP) type.

10. The laser chip of claim 8, wherein the BH laser is of a distributed feedback (DFB) type.

11. The laser chip of claim 1, wherein the substrate is InP.

12. The laser chip of claim 1, wherein the substrate is GaAs.

13. The laser chip of claim 1, wherein the substrate is GaN.

14. A laser chip comprising:
    a substrate;
    an epitaxial structure on the substrate, the epitaxial structure including an active region, the active region generating light;
    a first waveguide formed in the epitaxial structure extending in a first direction, the first waveguide having a first front etched facet and a first back etched facet that define a first edge-emitting laser;
    a second waveguide formed in the epitaxial structure extending in the first direction, the second waveguide having a second front etched facet and a second back etched facet that define a second edge-emitting laser;
    a first recessed region formed in said epitaxial structure, the first recessed region including a first end wall and two side walls and being arranged at a first distance from the waveguide and having an opening adjacent to one of the first back etched facet and the second back etched facet, the first recessed region facilitating testing of an adjacent laser chip prior to singulation of the laser chip; and
    a second recessed region formed in said epitaxial structure, the second recessed region including a second end wall and two side walls and being arranged at a second distance from the waveguide and having an opening adjacent to one of the first back etched facet and the second back etched facet;
    wherein the opening to the first recessed region and the opening to the second recessed region are aligned to each other.

15. The chip of claim 14, wherein at least one of the first and second edge-emitting lasers is a ridge distributed feedback (DFB) laser.

16. The laser of claim 14, wherein at least one of the first and second edge-emitting lasers is a Buried Heterostructure (BH) distributed feedback (DFB) laser.

* * * * *